(12) United States Patent
Tadi et al.

(10) Patent No.: US 8,890,594 B1
(45) Date of Patent: Nov. 18, 2014

(54) SYSTEM FOR FUNCTIONAL RESET ACROSS MULTIPLE CLOCK DOMAINS

(71) Applicants: Surendra Kumar Tadi, Ghaziabad (IN); Nitin Kumar Jaiswal, Noida (IN)

(72) Inventors: Surendra Kumar Tadi, Ghaziabad (IN); Nitin Kumar Jaiswal, Noida (IN)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/938,244

(22) Filed: Jul. 10, 2013

(51) Int. Cl.
*H03K 3/36* (2006.01)
*H03K 3/037* (2006.01)

(52) U.S. Cl.
CPC .................................... *H03K 3/0375* (2013.01)
USPC ........... 327/198; 327/143; 327/142; 327/117; 377/47

(58) Field of Classification Search
USPC .............. 327/113–122, 355–361; 377/47, 48; 455/323–330
See application file for complete search history.

(56) References Cited

U.S. PATENT DOCUMENTS

| | | | | |
|---|---|---|---|---|
| 6,163,584 | A  * | 12/2000 | Weng et al. | 375/354 |
| 7,046,052 | B1 * | 5/2006  | Percey et al. | 327/115 |
| 7,231,539 | B1 * | 6/2007  | Lee et al. | 713/600 |
| 2005/0258879 | A1 * | 11/2005 | Marutani | 327/117 |
| 2011/0148480 | A1 * | 6/2011  | Fan | 327/115 |

\* cited by examiner

*Primary Examiner* — Brandon S Cole
(74) *Attorney, Agent, or Firm* — Charles Bergere

(57) ABSTRACT

A system for synchronizing a functional reset between first and second clock domains that operate on first and second clock signals, respectively. The system includes first, second and third synchronizer flip-flops that operate on the second clock signal. The first synchronizer flip-flop receives a functional reset signal generated by the first clock domain at its reset terminal and generates a low output signal. The low output signal causes the second synchronizer flip-flop and subsequently the third synchronizer flip-flop to generate low output signals at positive edges of the second clock signal. The low output signal generated by the third synchronizer flip-flop is used to reset the second clock domain.

18 Claims, 3 Drawing Sheets

SYSTEM FOR FUNCTIONAL RESET ACROSS MULTIPLE CLOCK DOMAINS

BACKGROUND OF THE INVENTION

The present invention relates generally to integrated circuits, and more particularly, to a system for synchronizing functional resets in an integrated circuit.

Integrated circuits (ICs) such as System-on-a-Chip (SoC) type circuits, include various functional modules for performing different tasks. Examples of functional modules include processors, control logic, memories, system buses, and so forth. These modules usually are driven by one or more clock signals and depending on the system requirements, different functional modules may require different clock signals (having different frequencies); e.g., an integrated circuit may include one set of functional circuits that operates in a first clock domain and another set of functional circuits that operates in a second clock domain.

Often times, flip-flops in a first clock domain may generate a reset signal that is required to reset flip-flops in the second clock domain. An example of such an IC 102 is shown in FIG. 1. The IC 102 includes multiple clock domains including first and second clock domains 104a and 104b that operate on first and second clock signals, respectively. Each clock domain 104 includes a plurality of functional circuits such as flip-flops 106. For example, the first clock domain 104a includes a first chain of flip-flops of which the last flip-flop 106a is shown and the second clock domain includes a second chain of flip-flops of which first and last, i.e., receive and capture flip-flops 106b and 106c are shown. The path between the receive and capture flip-flops 106b and 106c is represented by a combinational path 108. In this example, the first chain of flip-flops receives the first clock signal and the second chain of flip-flops receives the second clock signal. The first chain of flip-flops generates a functional reset signal that is used to reset the second chain of flip-flops. To enable the reset mechanism, an output of the flip-flop 106a is connected to a NOT gate 110 and an output of the NOT gate 110 is input to an AND gate 112. An output of the AND gate 112 then is input to a reset terminal of the receive flip-flop 106b. A second input of the AND gate 112 and a reset terminal of the capture flip-flop 106c both receive a power-on-reset (POR) signal generated internally in the IC 102. The POR signal goes active (logic high) unless a system reset is required.

When the first chain of flip-flops generates a functional reset signal (that appears at the output of the flip-flop 106a), the NOT gate 110 inverts the reset signal to provide a logic low signal, which is received by the AND gate 112. The output of the AND gate 112 is a logic low signal, which resets the receive flip-flop 106b. As the first and second clock signals are asynchronous, the receive flip-flop 106b generates a logic low signal asynchronous to the second clock signal, which leads to timing violations at the capture flip-flop 106c through the combinational path 108. These timing violations can lead to erroneous operation of the IC 102.

Therefore, there is a need for a system that synchronizes a functional reset across multiple clock domains of an IC without introducing any timing violations, and that overcomes the above-mentioned limitations of existing IC.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION OF THE PRESENT INVENTION

Figure 1:
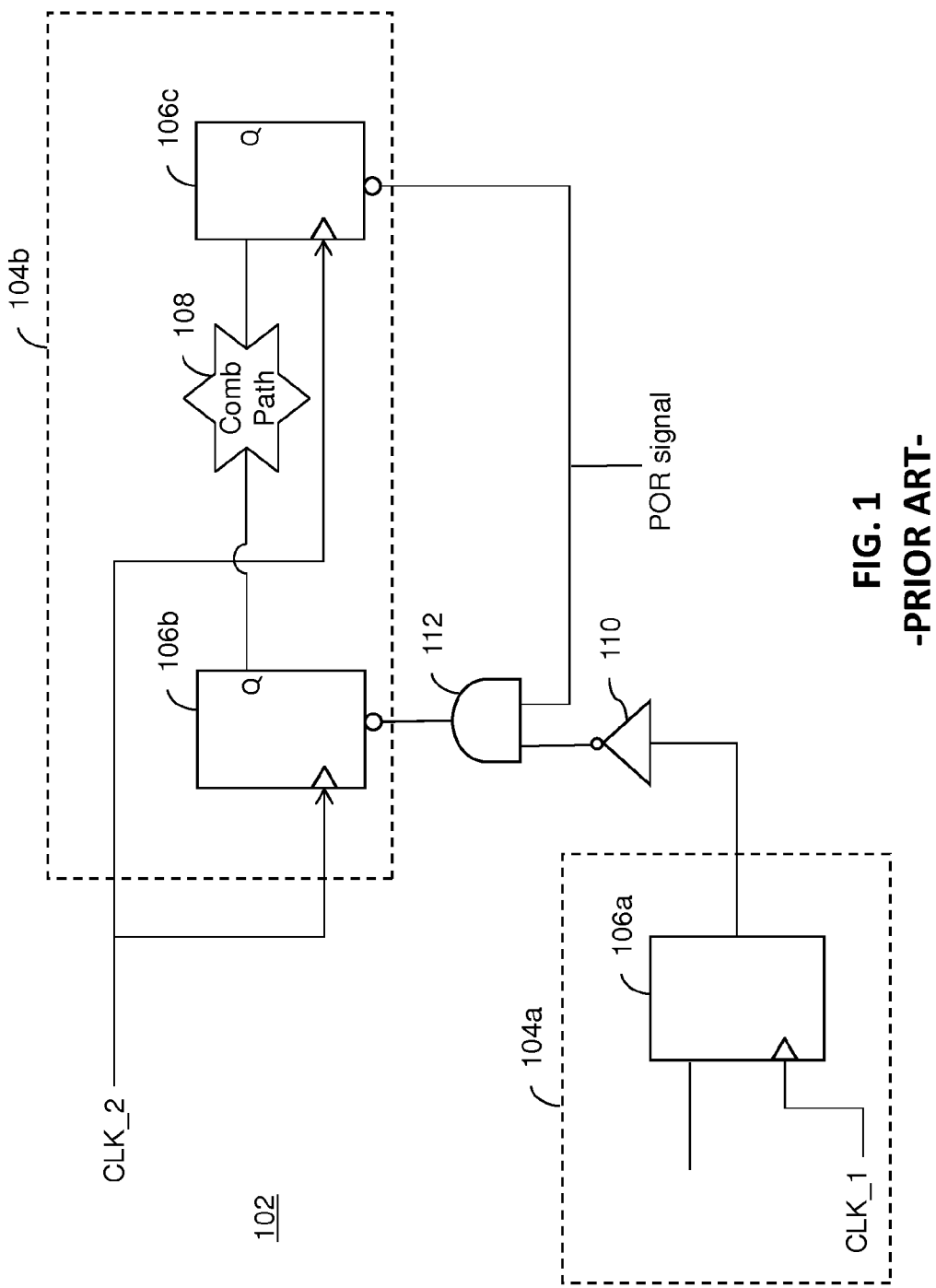
FIG. 1 is a schematic block diagram of a conventional integrated circuit.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In an embodiment of the present invention, a system for synchronizing a functional reset generated by a first chain of flip-flops with a second chain of flip-flops is provided. The first chain of flip-flops operates on a first clock signal and the second chain of flip-flops operates on a second clock signal. The system includes first, second and third flip-flops. The first flip-flop has an input terminal for receiving a logic high signal, a clock terminal for receiving the second clock signal and a reset terminal for receiving a functional reset signal from the first chain of flip-flops. The first flip-flop is reset when the functional reset signal is asserted. The second flip-flop has an input terminal connected to an output terminal of the first flip-flop and a clock terminal for receiving the second clock signal. The second flip-flop generates a first logic low signal at an output terminal thereof at a positive edge of the second clock signal. The third flip-flop has an input terminal connected to the output terminal of the second flip-flop for receiving the logic low signal and a clock terminal for receiving the second clock signal. The third flip-flop generates a second logic low signal at an output terminal thereof at a positive edge of the second clock signal. The output terminal of the third flip-flop is connected to reset terminals of the second chain of flip-flops for providing the second logic low signal thereto.

In another embodiment of the present invention, an integrated circuit is provided. The integrated circuit includes first and second chains of flip-flops of which the first chain of flip-flops operate using a first clock signal and the second chain of flip-flops operate using a second clock signal. The integrated circuit further includes a synchronizer circuit for synchronizing a functional reset generated by the first chain of flip-flops with the second chain of flip-flops. The synchronizer circuit includes first, second and third flip-flops. The first flip-flop has an input terminal for receiving a logic high signal, a clock terminal for receiving the second clock signal and a reset terminal for receiving a functional reset signal from the first chain of flip-flops. The first flip-flop is reset when the functional reset signal is asserted. The second flip-flop has an input terminal connected to an output terminal of the first flip-flop and a clock terminal for receiving the second clock signal. The second flip-flop generates a first logic low signal at an output terminal thereof at a positive edge of the second clock signal. The third flip-flop has an input terminal connected to the output terminal of the second flip-flop for receiving the logic low signal and a clock terminal for receiving the second clock signal. The third flip-flop generates a second logic low signal at an output terminal thereof at a positive edge of the second clock signal. The integrated circuit further includes first, second and third logic circuits. The first logic circuit is connected to the output terminal of the third flip-flop for inverting the second logic low signal and generating a logic high signal. The second logic circuit is connected to the first logic circuit for inverting the logic high signal and generating a third logic low signal. The third logic circuit has a first input terminal connected to the second logic circuit for receiving the third logic low signal, a second terminal for receiving a power-on-reset (POR) signal and an output terminal connected to the reset terminals of the second chain of flip-flops.

Various embodiments of the present invention provide a reset synchronizer circuit for synchronizing a functional reset generated by a first clock domain with a second clock domain of an integrated circuit. Flip-flops of the first clock domain operate on a first clock signal and flip-flops of the second clock domain operate on second clock signal. The reset synchronizer circuit includes first through third synchronizer flip-flops that operate in the second clock signal. When the flip-flops from the first clock domain generate a functional reset signal, the first synchronizer flip-flop receives the reset signal at a reset terminal thereof and generates a logic low signal. The logic low signal causes the second synchronizer flip-flop and hence the third synchronizer flip-flops to generate logic low signals at respective output terminals, at two consecutive positive edges of the second clock signal. The logic low signal generated by the third synchronizer flip-flop is synchronous with the second clock signal and is used to reset flip-flops of the second clock domain, thereby eliminating timing violations in switching of the flip-flops of the second clock domain.

Figure 2:
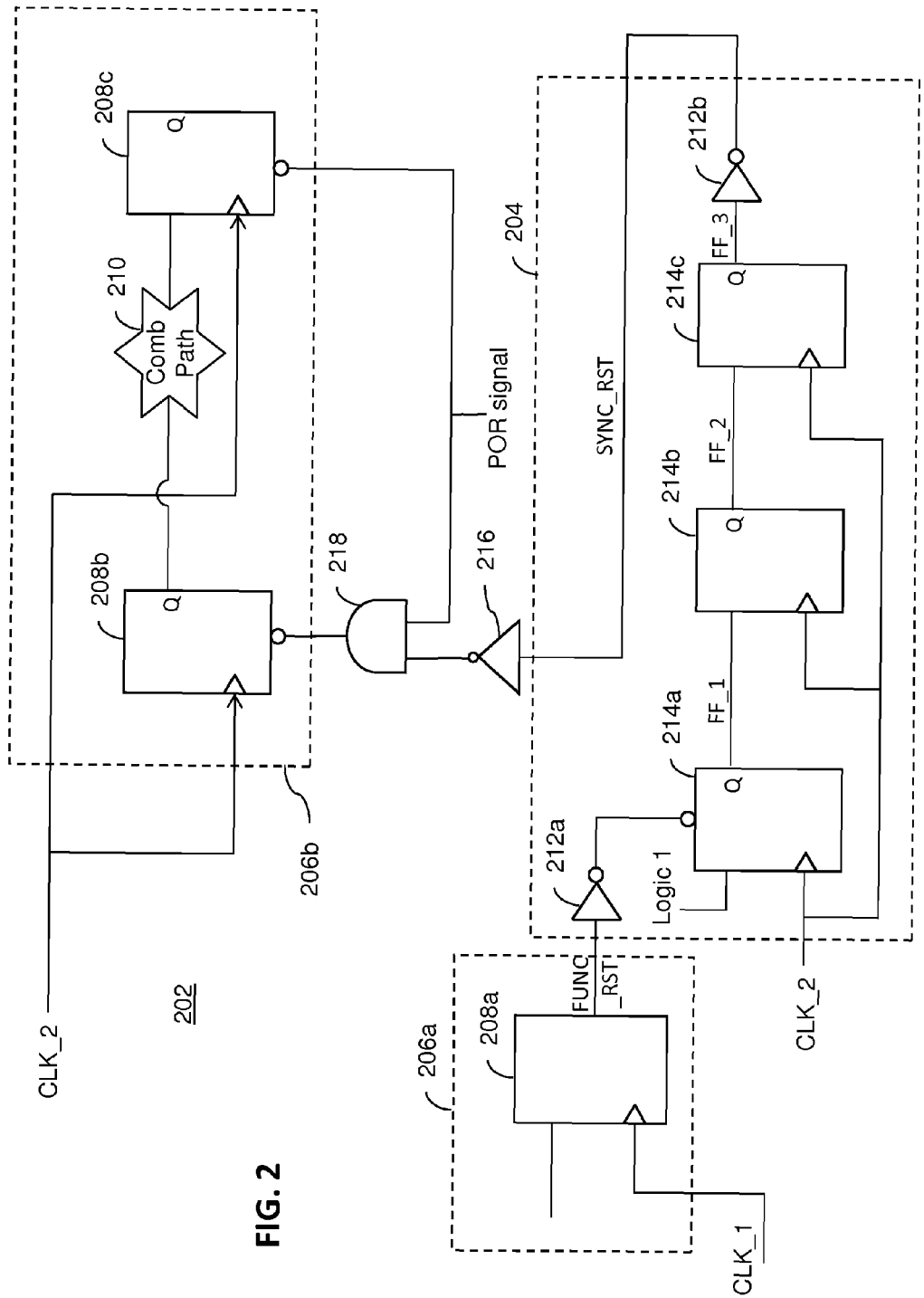
FIG. 2 is a schematic block diagram of an integrated circuit with a reset synchronizer circuit in accordance with an embodiment of the present invention.

Referring now to FIG. 2, a schematic block diagram of an integrated circuit (IC) 202 with a reset synchronizer circuit 204 in accordance with an embodiment of the present invention is shown. The IC 202 includes multiple clock domains including first and second clock domains 206a and 206b that operate on first and second clock signals, respectively. The first and second clock signals have different frequencies and are asynchronous to each other. Each clock domain 206 includes a plurality of functional circuits such as flip-flops 208. In an example, the first clock domain 206a includes a first chain of flip-flops of which the last flip-flop 208a is shown and the second clock domain includes a second chain of flip-flops of which first and last, i.e., receive and capture flip-flops 208b and 208c are shown. The path between the receive and capture flip-flops 208b and 208c is represented by a combinational path 210. The first chain of flip-flops receives the first clock signal and the second chain of flip-flops receives the second clock signal. The first chain of flip-flops generates a functional reset signal which is required to reset the second chain of flip-flops.

The reset synchronizer circuit 204 synchronizes the functional reset between the first and second clock domains 206a and 206b and includes a first and second NOT gates 212a and 212b and first thorough third synchronizer flip-flops 214a-214c. An output terminal of the flip-flop 208a is connected to the first NOT gate 212a and an output terminal of the first NOT gate 212a is connected to a reset terminal of the first synchronizer flip-flop 214a. An input terminal of the first synchronizer flip-flop 214a receives a logic high signal and an output terminal of the first synchronizer flip-flop 214a is connected to an input terminal of the second synchronizer flip-flop 214b and an output terminal of the second synchronizer flip-flop 214b is connected to an input terminal of the third synchronizer flip-flop 214c. An output terminal of the third synchronizer flip-flop 214c is connected to the second NOT gate 212b. Clock terminals of the first through third synchronizer flip-flops 214a-214c receive the second clock signal. An output terminal of the second NOT gate 212b is connected to the third NOT gate 216 and an output terminal of the third NOT gate 216 is connected to a first input terminal of the AND gate 218. An output terminal of the AND gate 218 is connected to a reset terminal of the receive flip-flop 208b. A second input terminal of the AND gate 218 and a reset terminal of the capture flip-flop 208c receive a power-on-reset (POR) signal generated internally in the IC 202. The POR signal usually stays in a logic high state unless a system reset is required.

Figure 3:
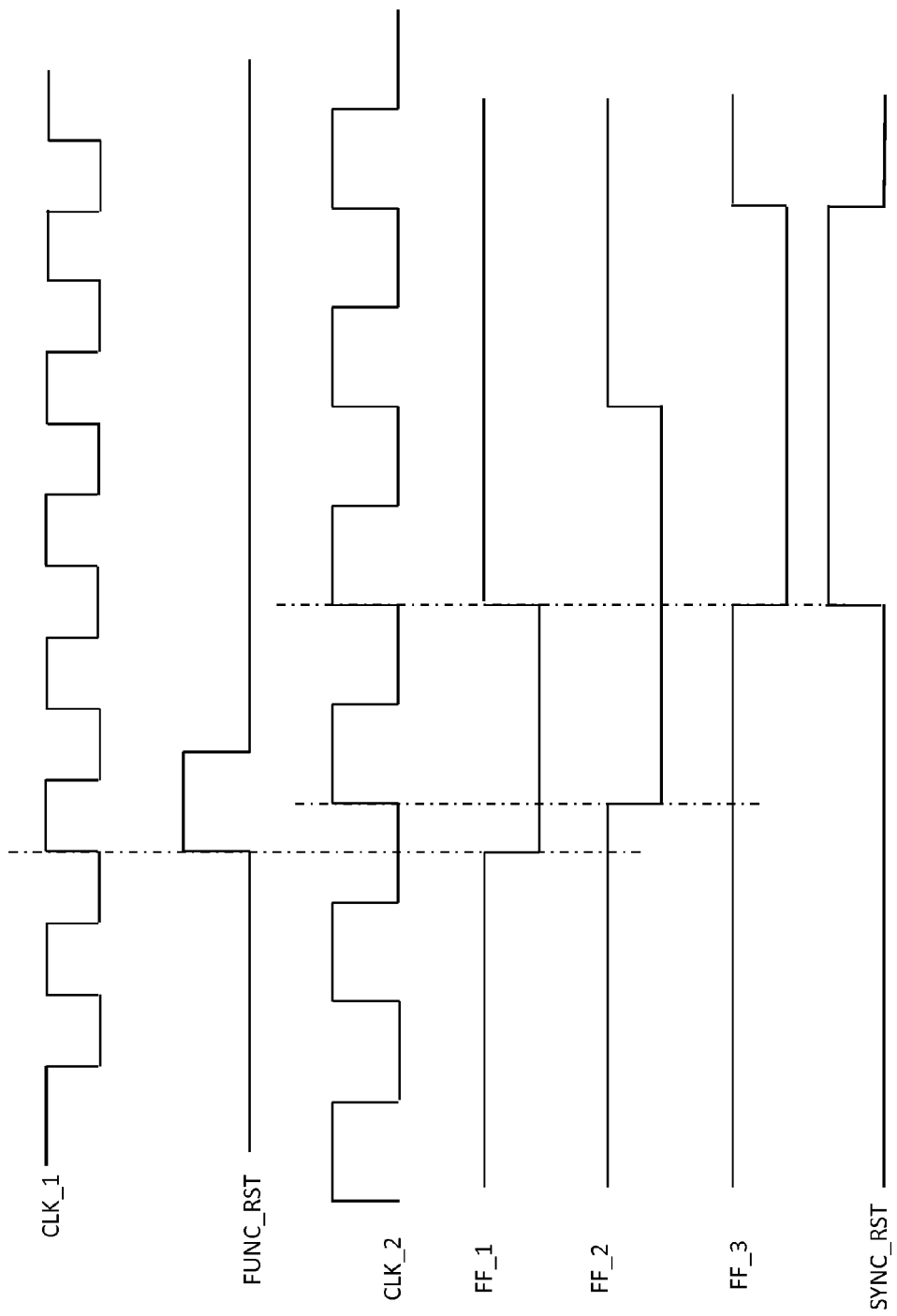
FIG. 3 is a timing diagram of various signals of the integrated circuit of FIG. 2 in accordance with an embodiment of the present invention.

The functioning of the IC 202 has been explained with by referring to the timing diagram of FIG. 3. When the first chain of flip-flops generates a functional reset signal (FUNC_RST, that appears at the output of the flip-flop 208a and is synchronous with the first clock signal CLK_1), the first NOT gate 212a receives and inverts the reset signal FUNC_RST to generate a logic low signal. The logic low signal resets the first synchronizer flip-flop 214a, i.e., output of the first synchronizer flip-flop 214a goes low. The logic low output FF_1 of the first synchronizer flip-flop 214a is received at the input terminal of the second synchronizer flip-flop 214b which generates a logic signal FF_2 at a positive edge of the second clock signal CLK_2 and similarly, the third synchronizer flip-flop 214c generates a logic low signal FF_3 at the next positive edge of the second clock signal CLK_2.

The second NOT gate 212b receives the logic low signal FF_3 and generates a logic high signal SYNC_RST which is now synchronous with the second clock signal CLK_2. The logic high signal SYNC_RST is then inverted by the third NOT gate 216 to generate a logic low signal, which causes the AND gate to switch to a logic low state and reset the receive flip-flop 208b. Thus, the receive flip-flop 208b is reset at the positive edge of the second clock signal CLK_2. Thereafter, the subsequent flip-flops of the second chain of flip-flops to the capture flip-flop 208c capture input data synchronously with the positive edge of the second clock signal CLK_2, which eliminates the timing violations from the second chain of flip-flops.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. A system for synchronizing a functional reset generated by a first chain of flip-flops that operate on a first clock signal, with a second chain of flip-flops that operate on a second clock signal, comprising:
   a first flip-flop having an input terminal for receiving a logic high signal, a clock terminal for receiving the second clock signal and a reset terminal for receiving a functional reset signal from the first chain of flip-flops, wherein the first flip-flop is reset when the functional reset signal is asserted;
   a second flip-flop having an input terminal connected to an output terminal of the first flip-flop and a clock terminal for receiving the second clock signal, wherein the second flip-flop generates a first logic low signal at an output terminal thereof, at a positive edge of the second clock signal; and a third flip-flop having an input terminal connected to the output terminal of the second flip-flop for receiving the logic low signal and a clock terminal for receiving the second clock signal, wherein the third flip-flop generates a second logic low signal at an output terminal thereof, at a positive edge of the second clock signal, wherein the output terminal of the third flip-flop is connected to reset terminals of the second chain of flip-flops for providing the second logic low signal thereto.

2. The system of claim 1, further comprising a first logic circuit, connected to the output terminal of the third flip-flop, for inverting the second logic low signal and generating a logic high signal.

3. The system of claim 2, further comprising a second logic circuit, connected to the first logic circuit, for inverting the logic high signal and generating a third logic low signal.

4. The system of claim 3, further comprising a third logic circuit having a first input terminal connected to the second logic circuit for receiving the third logic low signal, a second terminal for receiving a power-on-reset (POR) signal and an output terminal connected to the reset terminals of the second chain of flip-flops.

5. The system of claim 4, wherein the first and second logic circuits each comprise a NOT gate.

6. The system of claim 4, wherein the third logic circuit comprises an AND gate.

7. The system of claim 1, wherein the first and second clock signals are asynchronous.

8. An integrated circuit, comprising:
first and second chains of flip-flops that operate on first and second clocks signals, respectively; and
a synchronizer circuit, for synchronizing a functional reset generated by the first chain of flip-flops with the second chain of flip-flops, wherein the synchronizer circuit comprises:
  a first flip-flop having an input terminal for receiving a logic high signal, a clock terminal for receiving the second clock signal and a reset terminal for receiving a functional reset signal from the first chain of flip-flops, wherein the first flip-flop is reset when the functional reset signal is asserted;
  a second flip-flop having an input terminal connected to an output terminal of the first flip-flop and a clock terminal for receiving the second clock signal, wherein the second flip-flop generates a first logic low signal at an output terminal thereof, at a positive edge of the second clock signal; and
  a third flip-flop having an input terminal connected to the output terminal of the second flip-flop for receiving the logic low signal and a clock terminal for receiving the second clock signal, wherein the third flip-flop generates a second logic low signal at an output terminal thereof, at a positive edge of the second clock signal,
wherein the output terminal of the third flip-flop is connected to reset terminals of the second chain of flip-flops for providing the second logic low signal thereto.

9. The integrated circuit of claim 8, further comprising a first logic circuit, connected to the output terminal of the third flip-flop, for inverting the second logic low signal and generating a logic high signal.

10. The integrated circuit of claim 9, further comprising a second logic circuit, connected to the first logic circuit, for inverting the logic high signal and generating a third logic low signal.

11. The integrated circuit of claim 10, further comprising a third logic circuit having a first input terminal connected to the second logic circuit for receiving the third logic low signal, a second terminal for receiving a power-on-reset (POR) signal and an output terminal connected to the reset terminals of the second chain of flip-flops.

12. The integrated circuit of claim 11, wherein the first and second logic circuits each comprise a NOT gate.

13. The integrated circuit of claim 11, wherein the third logic circuit comprises an AND gate.

14. The integrated circuit of claim 8, wherein the first and second clock signals are asynchronous.

15. An integrated circuit, comprising:
first and second chains of flip-flops that operate on first and second clocks signals, respectively; and
a synchronizer circuit, for synchronizing a functional reset generated by the first chain of flip-flops with the second chain of flip-flops, wherein the synchronizer circuit comprises:
  a first flip-flop having an input terminal for receiving a logic high signal, a clock terminal for receiving the second clock signal and a reset terminal for receiving a functional reset signal from the first chain of flip-flops, wherein the first flip-flop is reset when the functional reset signal is asserted;
  a second flip-flop having an input terminal connected to an output terminal of the first flip-flop and a clock terminal for receiving the second clock signal, wherein the second flip-flop generates a first logic low signal at an output terminal thereof, at a positive edge of the second clock signal; and
  a third flip-flop having an input terminal connected to the output terminal of the second flip-flop for receiving the logic low signal and a clock terminal for receiving the second clock signal, wherein the third flip-flop generates a second logic low signal at an output terminal thereof, at a positive edge of the second clock signal, wherein the output terminal of the third flip-flop is connected to reset terminals of the second chain of flip-flops for providing the second logic low signal thereto;
a first logic circuit, connected to the output terminal of the third flip-flop, for inverting the second logic low signal and generating a logic high signal;
a second logic circuit, connected to the first logic circuit, for inverting the logic high signal and generating a third logic low signal; and
a third logic circuit having a first input terminal connected to the second logic circuit for receiving the third logic low signal, a second terminal for receiving a power-on-reset (POR) signal and an output terminal connected to the reset terminals of the second chain of flip-flops.

16. The integrated circuit of claim 15, wherein the first and second logic circuits each comprise a NOT gate.

17. The integrated circuit of claim 15, wherein the third logic circuit comprises an AND gate.

18. The integrated circuit of claim 15, wherein the first and second clock signals are asynchronous.

* * * * *